United States Patent
Cheung et al.

(10) Patent No.: US 7,468,324 B2
(45) Date of Patent: Dec. 23, 2008

(54) MICROELECTROMECHANICAL DEVICES AND THEIR FABRICATION

(75) Inventors: Rebecca Cheung, Edinburgh (GB); Liudi Jiang, Edinburgh (GB)

(73) Assignee: The University Court of the University of Edinburgh, Edinburgh (GB)

(*) Notice: Subject to any disclaimer, the term of this patent is extended or adjusted under 35 U.S.C. 154(b) by 3 days.

(21) Appl. No.: 11/296,908

(22) Filed: Dec. 8, 2005

(65) Prior Publication Data
US 2006/0160262 A1    Jul. 20, 2006

Related U.S. Application Data

(60) Provisional application No. 60/634,218, filed on Dec. 8, 2004.

(51) Int. Cl.
    *H01L 21/302* (2006.01)
(52) U.S. Cl. ..................... 438/706; 438/719
(58) Field of Classification Search ............. 438/706, 438/710, 712, 714, 719, 720, 723, 724, 725, 438/745
    See application file for complete search history.

(56) References Cited

U.S. PATENT DOCUMENTS

| | | | | |
|---|---|---|---|---|
| 4,352,724 A | * | 10/1982 | Sugishima et al. | 204/192.37 |
| 5,767,017 A | * | 6/1998 | Armacost et al. | 438/694 |
| 5,882,468 A | * | 3/1999 | Crockett et al. | 156/345.3 |
| 6,174,806 B1 | * | 1/2001 | Thakur et al. | 438/653 |
| 6,492,283 B2 | * | 12/2002 | Raaijmakers et al. | 438/770 |
| 6,635,185 B2 | * | 10/2003 | Demmin et al. | 216/64 |
| 6,815,243 B2 | * | 11/2004 | Lucak et al. | 438/52 |
| 2003/0060051 A1 | * | 3/2003 | Kretschmann et al. | 438/694 |
| 2003/0062322 A1 | * | 4/2003 | Walton et al. | 210/749 |

OTHER PUBLICATIONS

L. Jiang et al., "Dry release fabrication and testing of SiC electrostatic cantilever actuators," Microelectronic Engineering, 78-79 (2005) pp. 106-111.
Y.T. Yang et al., "Monocrystalline silicon carbide nanoelectromechanical systems," Applied Physics Letters, vol. 78, No. 2, pp. 162-164, Jan. 8, 2001, American Institute of Physics.
L. Jiang et al., "Fabricaton of SiC microelectromechanical systems (MEMS) using one-step dry etching," J. Vac. Sci. Technol. B 21(6), Nov./Dec. 2003, pp. 1-4, American Vacuum Society.

* cited by examiner

*Primary Examiner*—Kin-Chan Chen
(74) *Attorney, Agent, or Firm*—RatnerPrestia

(57) ABSTRACT

A method of fabricating microelectromechanical (MEMs) systems and in particular for producing silicon carbide (SiC) MEMs devices with improved mechanical properties. The method comprises reacting a dry etch plasma with a layered microstructure; the layered microstructure having an etch mask, a sacrificial layer and a device layer arranged between the etch mask and the sacrificial layer. The dry etch plasma is introduced into the environment of the layered microstructure such that the device layer is etched anisotropically and the sacrificial layer is etched substantially isotropically. The invention also provides a method for tuning MEMs devices by material de-stressing using an inert gas in the dry etch plasma.

35 Claims, 18 Drawing Sheets

Fig.2
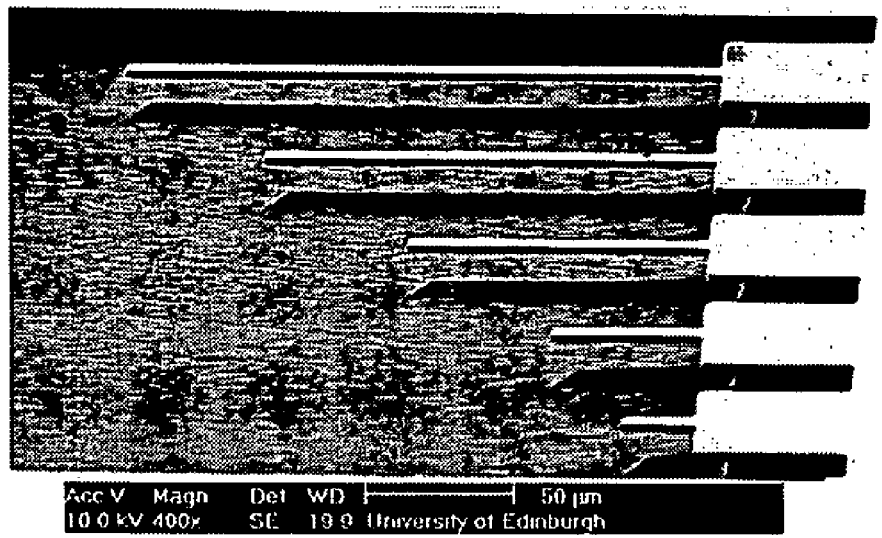
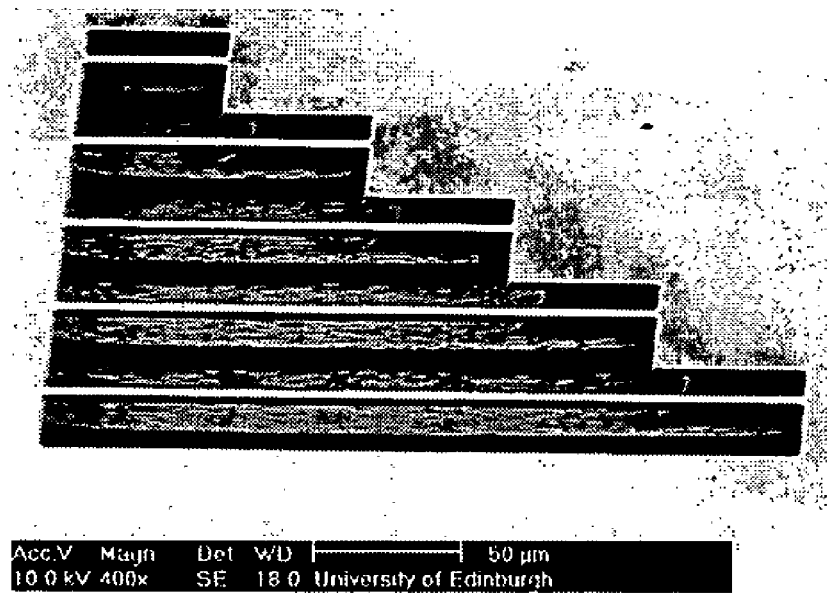
Fig. 3

Fig. 4
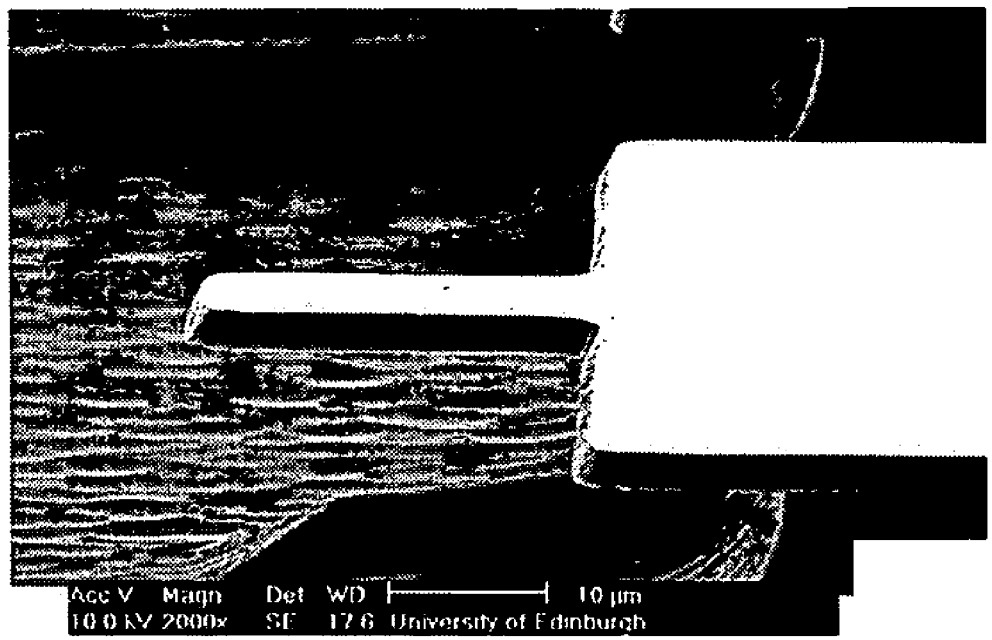
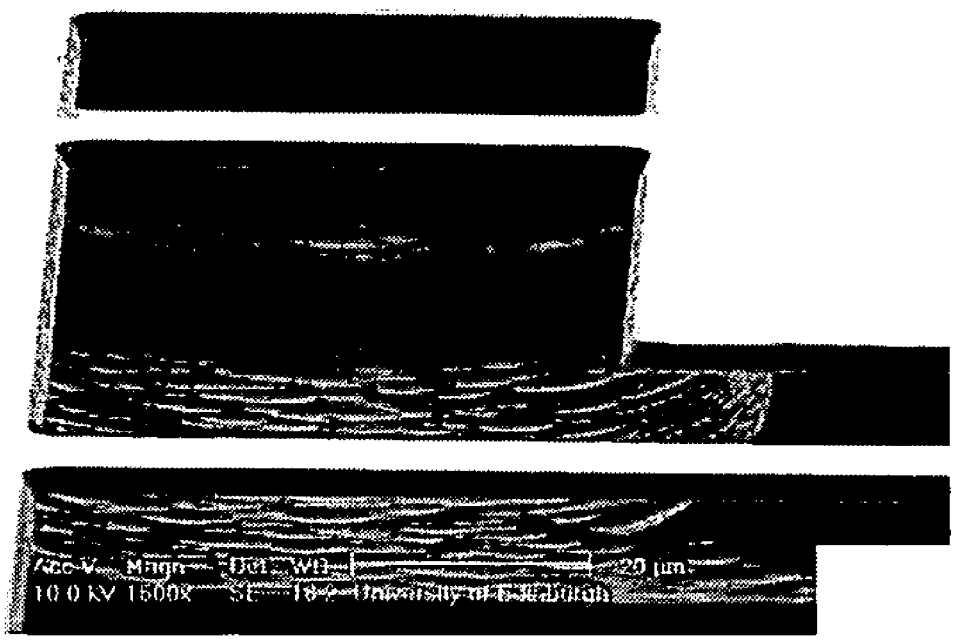
Fig. 5

Fig.9a
Fig.9b
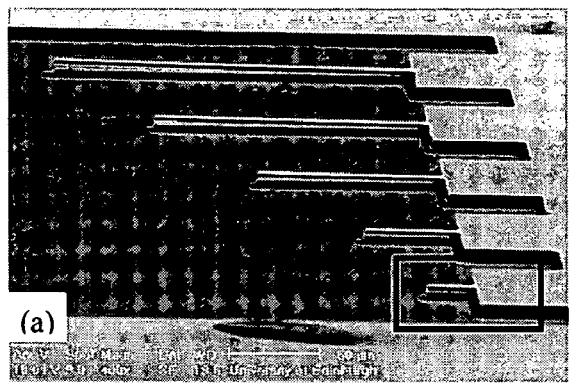
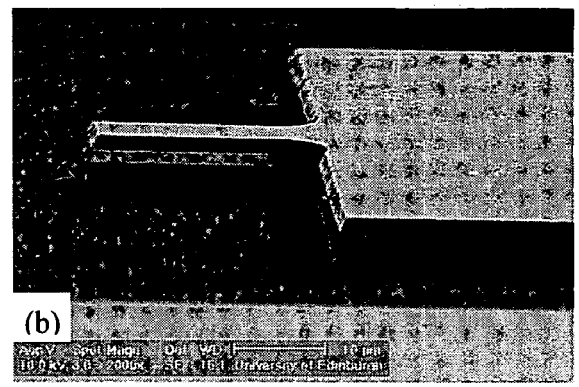

Fig.13a
Fig.13b
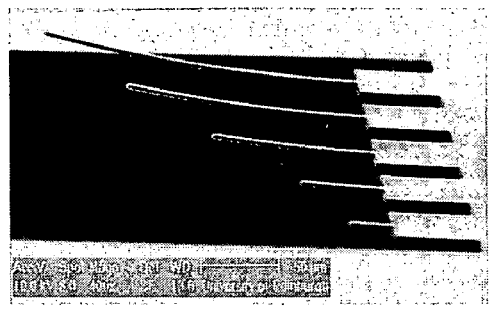
Before CF$_4$+H$_2$ plasma reaction
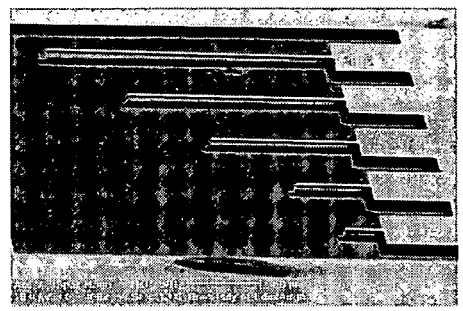
After CF$_4$+H$_2$ plasma reaction for 4.5 hrs.
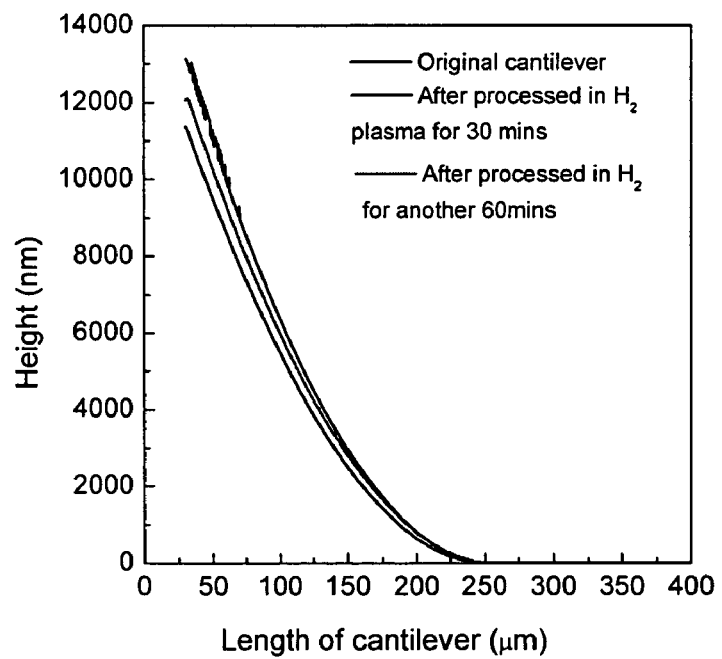
Fig.14
A 200 μm long cantilever profile after processed in H$_2$ plasma. The original cantilever has NiCr metal on top.

Note: This fig is from a 200 micro long SiC cantilever without any mask material on top.

Beam profiles before and after plasma processing - SetH-25microns

Beam Profiles before and after plasma processing - SetH-50microns

Beam Profiles before and after plasma processing - Setl-100microns

Beam Profiles before and after plasma processing - Setl-150microns

MICROELECTROMECHANICAL DEVICES AND THEIR FABRICATION

This application claims the benefit of priority to U.S. Provisional Patent Application No. 60/634,218, filed on Dec. 8, 2004, the contents of which are incorporated in this application by reference.

FIELD OF THE INVENTION

The present invention relates to a method of fabricating microelectromechanical (MEMs) systems and in particular for producing silicon carbide (SiC) MEMs devices with improved mechanical properties.

BACKGROUND OF THE INVENTION

Although micromachining techniques for silicon are well developed and a range of silicon MEMs have been fabricated, Si MEMs are not suitable for use in harsh environments including locations of high temperature, high vibrational frequency, high wear and those containing corrosive media. In contrast, silicon carbide (SiC) is an excellent material for microsensors and microactuators for use in extreme conditions due to its outstanding physical and chemical properties. In particular, because of the high Young's modulus (E) of SiC and the relatively low-mass density $\rho$ the larger ratio of $\sqrt{E/\rho}$ will result in significantly higher resonant frequencies for SiC beam structures compared to their silicon and gallium arsenide counterparts.

Micromachined SiC resonant devices including pressure sensors, lateral resonant structures and micromotors are known. However, most of the fabricated devices make use of bulk micromachining or micromolding techniques that tend to be more complex than surface micromaching. Significant bending effects have also been observed in released cantilever beams, especially in longer beam structures. The bending effect has been attributed to the result of a bending moment induced by a residual stress gradient through the film thickness, the presence of the mask and the surface tension encountered in wet etch processes. In addition, compared with dry etching techniques, there is also less control of etch rates and etch profiles using wet etch to release resonance structures.

SUMMARY OF THE INVENTION

Recently, nanoelectromechanical systems have been fabricated using surface micromachining techniques and a two-step dry-etch process.

It is an object of the present invention to provide a SiC MEMs device with improved physical properties using a novel fabrication method. It is a further object of the present invention to produce released SiC cantilevers and bridge MEMs structures.

In accordance with a first aspect of the present invention there is provided a microstructure fabrication method comprising the steps of:

reacting a dry etch plasma with a layered microstructure, the layered microstructure having an etch mask, a sacrificial layer and a device layer arranged between the etch mask and the sacrificial layer, wherein the dry etch plasma is introduced into the environment of the layered microstructure such that the device layer is etched anisotropically and the sacrificial layer is etched substantially isotropically.

The high density dry etch plasma may have a density of greater than $10^{10}$ ions/cm$^3$.

The high density dry etch plasma may have a density of greater than $10^{11}$ ions/cm$^3$.

The sacrificial layer may be situated on a substrate.

The sacrificial layer and the substrate may be made from the same material.

The dry etch plasma may be introduced into the environment of the layered microstructure in a single step.

The sacrificial layer may comprise silicon.

The sacrificial layer may comprise polysilicon.

The device layer may comprise silicon carbide.

The high etch rate selectivity of silicon carbide to silicon or polysilicon coupled with the highly isotropic nature of the polysilicon etch means that the high density dry etch plasma may be used to pattern and release the SiC beams in a single, continuous process without damaging beams during the release period of the process.

The substrate layer may comprise silicon.

The etch mask may comprise silicon dioxide.

The etch mask may comprise Nichrome or other suitable metal materials.

The etch mask may be shaped to allow the production of a cantilever structure.

The etch mask may shaped to allow the production of a bridge structure.

The high density dry etch plasma may be inductively coupled.

The high density dry etch plasma may be an electron cyclotron resonance plasma.

The high density dry etch plasma may be a reactive ion etching plasma.

The high density dry etch plasma may contain a fluorinated plasma.

The plasma may contain $SF_6$.
The plasma may contain $NF_3$.
The plasma may contain $CF_4$.
The plasma may contain $CHF_3$.
The plasma may contain $O_2$.
The plasma may contain $H_2$.
The dry etch plasma may contain $SF_6$ and $O_2$.

The $SF_6/O_2$ mixture may be optimised to etch the device layer anisotropically and the sacrificial layer isotropically with high selectivity using the etch mask.

The $SF_6/O_2$ gas mixture may be optimised to contain 20% $O_2$.

The optimised mixture gives the highest SiC etch rate.

The dry etch plasma may comprises about 40 sccm $SF_6$ and about 10 sccm $O_2$ at a working pressure of about 5 mT pressure.

The dry etch plasma may be inductively coupled.

A 1000W ICP coil power and 50W chuck power corresponding to around −100V dc bias inductively couples the dry etch plasma.

Straight cantilever and bridge structures can be fabricated successfully and the resonant frequencies of the devices theoretically simulated and experimentally measured. By comparing the theoretically simulated and experimentally measured resonant frequencies, it has been found that the amount of stress in the cantilever beams is substantially reduced. The bridge structures are under significant tensile stress whose magnitude is independent of the bridge length.

The etch selectivity for silicon and silicon carbide may be 10:1 or greater.

Optionally, the method further comprises a wet etch step for the purpose of enhancing the removal of the etch mask.

Alternatively, the method further comprises a dry etch step for enhancing the removal of the etch mask.

The method of the present invention avoids the potential damage due to surface tension and the lack of control on etch rates and etch profiles encountered in wet etch processes. The fabricated structures have been successfully actuated and the fundamental resonant frequencies have been measured and compared theoretically with simulated data.

In accordance with a second aspect of the present invention there is provided a microelectromechanical device made from a microstructure manufactured by the method of the first aspect of the present invention.

The microelectromechanical device may have a bridge structure.

Alternatively, the microelectromechanical device has a cantilever structure.

The microelectromechanical device may be a tuneable radio frequency component.

The cantilever may be a movable plate of a capacitor and its displacement may be controlled by the voltage applied across the device.

The voltage may be applied across a top NiCr/SiC plate and a bottom bulk Si electrode.

The microelectromechanical device may serve as a mechanical resonator.

The microelectromechanical device may serve as a pressure sensor.

The microelectromechanical device may serve as an accelerometer.

The microelectromechanical device may serve as a micromotor.

The microelectromechanical device may be electrostatically actuated.

The microelectromechanical device may be thermally actuated.

The microelectromechanical device may be provided with electrodes.

In accordance with a third aspect of the invention there is provided a method of tuning the stress of a microstructure, the method comprising the steps of:

subjecting a layered microstructure to a dry etch plasma, the layered microstructure having a device layer arranged, wherein the dry etch plasma contains ions which act to controllably tune the microstructure.

The dry etch plasma may be a high density dry etch plasma.

The dry etch plasma may contain ions that are substantially unreactive with the microstructure.

The dry etch plasma may contain Hydrogen ions.

The dry etch plasma may contain inert gas ions.

The dry etch plasma may contain Argon ions.

An embodiment of the method allows tuning to occur using a voltage supply of around 150 to 350 volts.

The device layer may be tuned.

The dry etch plasma may contain chemically reactive ions.

These ions allow the lattice of the micro structure to be relaxed and the stress in the microstructure to be tuned.

The chemically reactive ions may be produced using a fluorinated gas.

The microstructure further comprises an etch mask and a sacrificial layer.

The microstructure may be a suspended structure.

The microstructure may be a cantilever.

In accordance with a fourth aspect of the invention there is provided a microelectromechanical device having a suspended structure and a shape determined by the stress gradient along the suspended structure, wherein the stress gradient is tunable by application of a plasma to the microelectromechanical device.

The microelectromechanical device may have a device layer made from SiC.

The dry etch plasma may be a high density dry etch plasma.

The dry etch plasma may contain ions that are substantially unreactive with the microstructure.

The dry etch plasma may contain Hydrogen ions.

The dry etch plasma may contain inert gas ions.

The dry etch plasma may contain Argon ions.

This method allows tuning to occur using a voltage supply of around 150 to 350 volts.

The device layer may be tuned.

The dry etch plasma may contain chemically reactive ions.

BRIEF DESCRIPTION OF THE DRAWINGS

The present invention will now be described by way of example only with reference to the accompanying drawings in which:

FIG. 2 is a scanning electron microscope (SEM) image of a number of free standing cantilever beams with lengths of 25, 50, 100, 150 and 200 micrometers;

FIG. 3 is a scanning electron microscope (SEM) image of a number of bridge structures 50, 100, 150, 200 and 250 micrometers;

FIG. 4 is a scanning electron microscope (SEM) image of a single free standing cantilever beam 25 micrometers in length;

FIG. 5 is a scanning electron microscope (SEM) image of a bridge structure 25 micrometers in length;

FIGS. 9a and 9b show scanning electron microscope (SEM) images of released cantilever structures fabricated using the aforementioned process.

FIG. 13a shows a stressed set of cantilever structures and FIG. 13b shows the same cantilevers having been de-stressed;

FIG. 14 is a graph that shows the effect of tuning a cantilever in a hydrogen plasma;

DETAILED DESCRIPTION OF THE INVENTION

In one embodiment of the invention the starting material is nominally undoped 2 μm thick single-crystalline 3C—SiC film heteroepitaxially grown on Si (100) wafers.

3C—SiC growth is achieved using a known two-step, carbonization-based, atmospheric pressure chemical vapour deposition process. After the samples had been ultrasonically cleaned in acetone and isopropanal, a 3 μm thick $SiO_2$ etch mask layer is deposited on the samples using plasma-enhanced chemical vapour deposition system.

Photoresist (in this case Megaposit SPR2-2FX 1.3) is spun on top of the $SiO_2$ covered samples. Photolithography is then performed to pattern the oxide in the shape of the cantilevers and bridges. The cantilevers are of widths 15 μm and of lengths 25, 50, 100, 150, 200 μm.

The bridges have widths 15 μm and lengths of 50, 100, 150, 200, 250 μm.

After photoresist development, a plasmatherm PK 2440 reactive ion etching system is used to remove the patterned $SiO_2$ layer exposing the SiC underneath. The remaining photoresist is removed using $O_2$ plasma. Subsequently, inductively coupled plasma (ICP) using $SF_6/O_2$ gas mixtures is optimised to etch the SiC anisotropically and the underlying silicon isotropically with high selectivity using the patterned $SiO_2$ etch mask.

The fabricated cantilever and bridge structures have been tested dynamically by attaching them to a piezoelectric disc with a low-melting-point soft wax and vibrating them in a vacuum system. The piezoelectric disc has been driven from a swept sine source and the vibration of the beams as a function of frequency has been detected using a known optical vibrometer.

Figure 1:
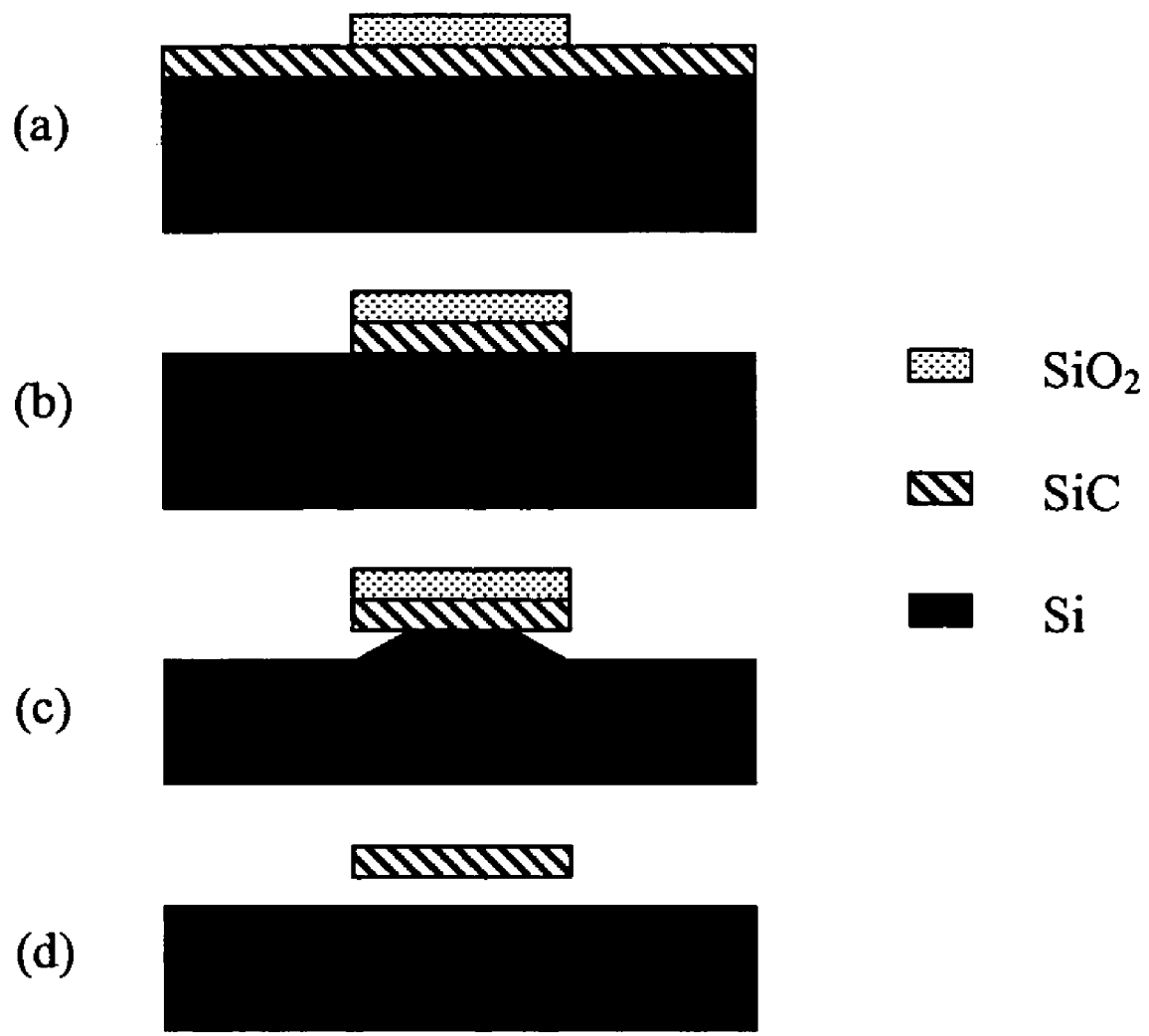
FIGS. 1a to 1d are schematic diagrams of the processing steps for fabricating a suspended SiC beam.

FIGS. 1a to 1d show the processing steps in microstructure fabrication. FIG. 1a shows a starting material which comprising a $SiO_2$ etch mask layer and a Si substrate with a SiC layer positioned between the etch mask and the substrate.

In FIG. 1b, an optimised $SF_6/O_2$ plasma is introduced. The SiC layer that is not covered by the $SiO_2$ etch mask is removed by the $SF_6/O_2$ plasma. The presence of the $SiO_2$ layer allows the optimised $SF_6/O_2$ plasma to firstly etch the SiC layer anisotropically. This reaction exhibits the characteristics of a dominant ion-induced etch mechanism to give an anisotropic vertical etch mechanism.

FIG. 1c shows the stage in the process where the Si substrate is etched isotropically underneath the SiC layer. This etching occurs with a high selectivity as a consequence of the presence of the $SiO_2$ mask. The reaction exhibits the characteristics of a spontaneous reaction between the F atoms in $SF_6$ and the Si substrate to provide the substantially isotropic uniform etch rate in all directions to allow the device layer to be undercut.

As shown in FIG. 1d, the undercut step finally releases the cantilevers and bridges and forms suspended structures. 20% $O_2$ in the gas mixtures is an optimum condition corresponding to higher etch rates.

In this example of the present invention, the optimised etching condition chosen for the fabrication of the SiC beams as well as their release has been 40 sccm $SF_6$ and 10 sccm $O_2$, 5 mT work pressure, 1000W ICP coil power and 50W chuck power corresponding to about −96V dc bias. Under these conditions, a SiC etch rate of 276 nm/min. and silicon etch rate of 2.7 μm/minute have been achieved.

In the above example, the etch selectivity of about 10:1 or greater for Si to SiC means that SiC can automatically act as a mask material during the Si substrate etching, thus releasing the resonance devices.

After the release etch, the longest cantilever structure has been observed to be slightly bent downwards, probably due to the stress induced by the $SiO_2$ onto the SiC. After removal of the remaining $SiO_2$ layer in hydrofluoric acid and rinsing the samples in deionized water, straight cantilever and bridge structures have been achieved as shown in FIGS. 2 and 3.

This post-release wet etch procedure did not result in obvious damage to the beam structures. FIGS. 4 and 5 show close-up scanning electron microscopy (SEM) images of a 25 μm long cantilever and a 50 μm long bridge where the anisotropic etching of the SiC beam and isotropic Si etching underneath the SiC layer can be clearly observed.

The straightness of cantilever beams in the absence of the $SiO_2$ mask indicates the absence of a stress gradient within the SiC layer.

The cantilevers and bridges have been mechanically actuated and the fundamental resonant frequencies have been measured in a vacuum system. In addition, the fabricated structures have been simulated (including the existence of undercut) in order to compare the theoretically predicted resonant frequencies to the measured resonant frequencies. SiC thickness of 2 μm was initially used during the simulation for both cantilevers and bridges.

Figure 6A:
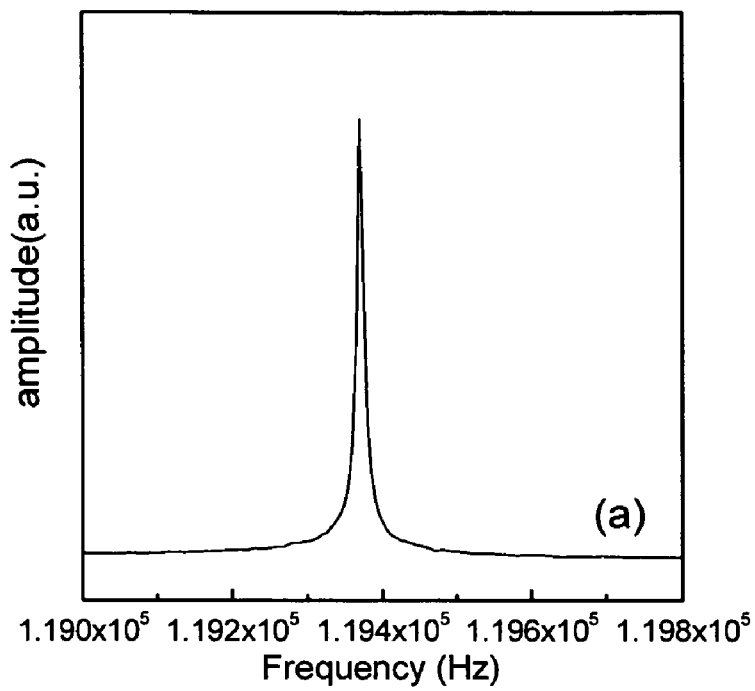
FIG. 6a shows the fundamental resonance peak of a 200 micrometer long cantilever and FIG. 6b shows the fundamental resonance peak of a 200 micrometer long bridge structure.
Figure 6B:
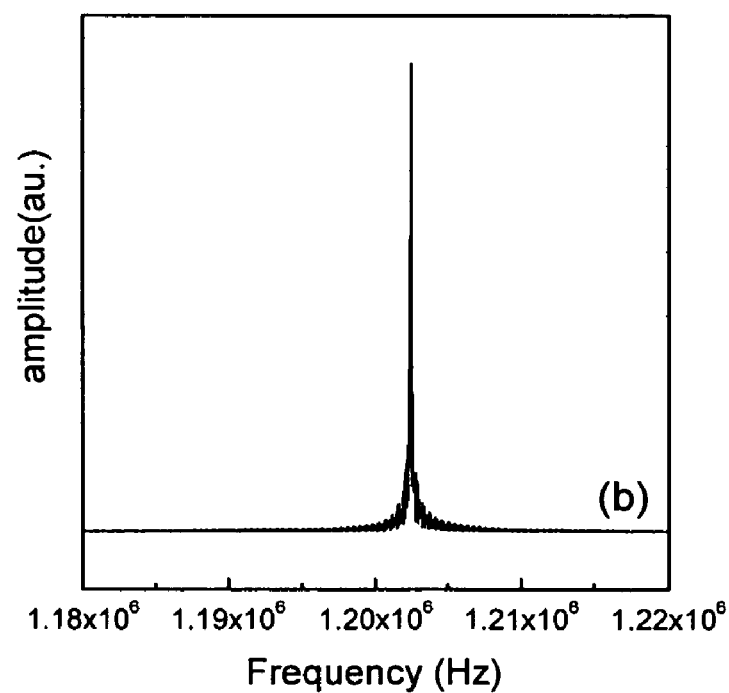

FIGS. 6a and 6b show fundamental resonance peaks of 200 μm long cantilever and bridge, respectively. The experimentally measured and the theoretically simulated resonant frequencies of all the fabricated beams are listed in Table I (a) and (b) below.

| (a) | | | |
|---|---|---|---|
| Cantilever length | Measured Frequency | Simulated Frequency | Correction factor |
| 200 μm | 119.4 KHz | 81.5 KHz | 1.47 |
| 150 μm | 208.6 KHz | 142.9 KHz | 1.46 |
| 100 μm | 451.7 KHz | 305.9 KHz | 1.48 |
| 50 μm | 1.59 MHz | 1.08 MHz | 1.47 |
| 25 μm | 5.05 MHz | 3.37 MHz | 1.5 |

| (b) | | | |
|---|---|---|---|
| Bridge length | Measured Frequency | Simulated Frequency | Correction factor |
| 250 μm | 898 KHz | 322.2 KHz | 2.79 |
| 200 μm | 1.2 MHz | 491.5 KHz | 2.44 |
| 150 μm | 1.79 MHz | 838.6 KHz | 2.13 |
| 100 μm | 3.3 MHz | 1.73 MHz | 1.91 |
| 50 μm | Out of range | 5.33 MHz | * |

A correction factor has been used to quantify the discrepancy between the theoretically predicted and the experimentally measured fundamental resonant frequencies. The correction factor is calculated from the measured frequencies divided by the correspondingly simulated frequencies. It is evident that the correction factors for the cantilevers are almost constant while the correction factors for the bridges decrease with decreasing bridge lengths.

For the cantilevers, it is possible to match the simulated resonant frequencies to the measured frequencies by taking into account the possible variation in the SiC layer thickness. SEM measurement has shown SiC thickness of about 2.9 μm. Therefore, in this case, using a SiC layer thickness of 3 μm instead of 2 µm would bring the theoretical and measured values into alignment, i.e. a correction factor of 1.

The correction factors for the bridges in Table 1 are not constant which indicates that the discrepancy between the measured and simulated frequencies is due not only to thickness variations for the bridge structures. The higher measured frequencies could result from the existence of stress in the bridge structures. The equation relating the natural frequency of a bridge to the degree of stress along its length is as follows:

$$\omega^2 L^4 = \alpha + \beta P L^2 \qquad (1)$$

where $\omega$ is $2\pi$ times the frequency of the stressed bridge, $\alpha$ and $\beta$ are constants depending on beam material, dimensions, L is the length of the beam and P is the stress in the bridge.

Figure 7:
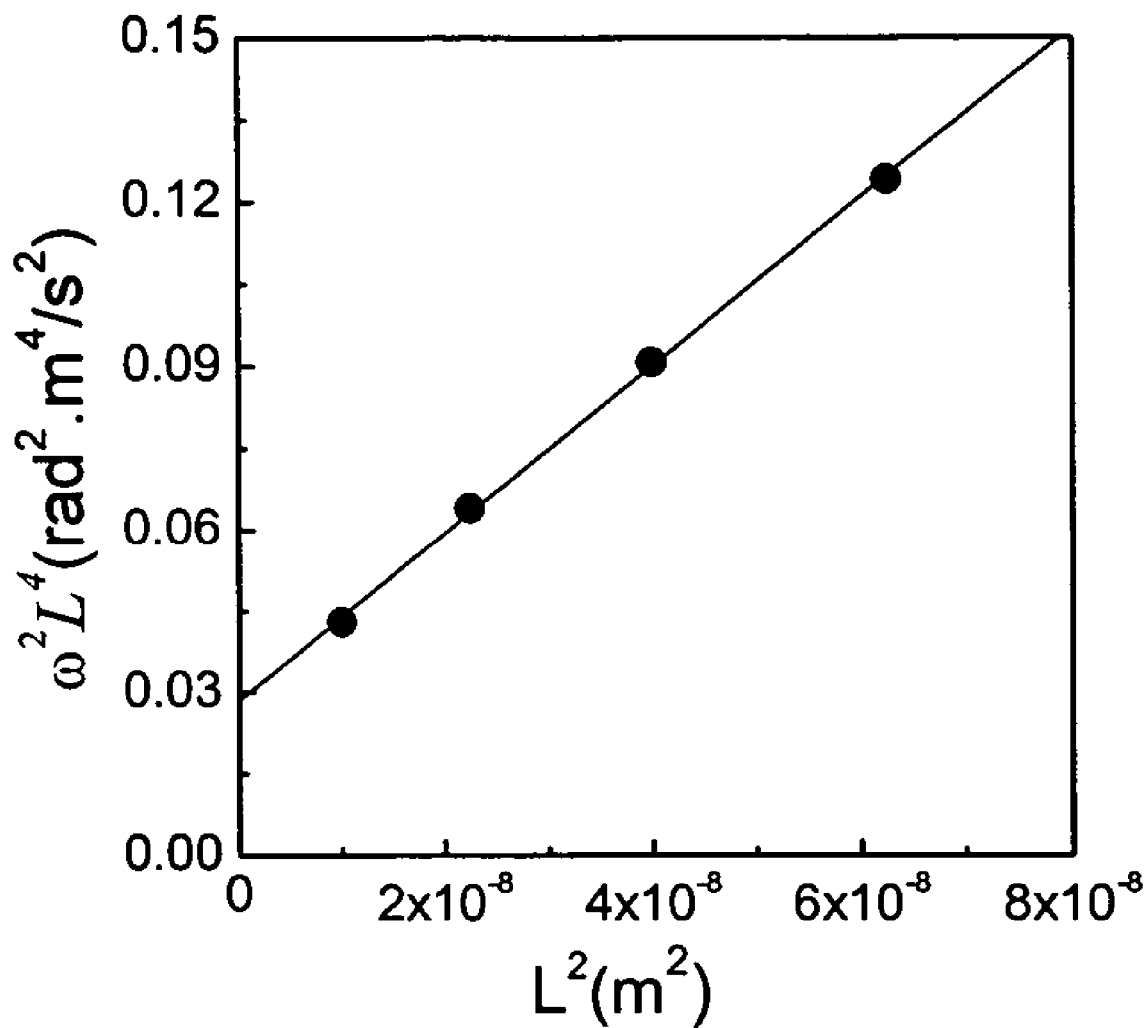
FIG. 7 is a graph of $\omega^2 L^4$ as a function of $L^2$ for bridge structures.

FIG. 7 shows a plot of $\omega^2 L^4$ as a function of $L^2$ which follows a linear trend. This result shows that the bridges are under tensile stress and the constant slope of the fitted line indicates that the degree of tension is independent of the bridge length. Assuming stress-free and string-mode shapes for the bridges, a significant tensile stress of about 400~500 MPa can be estimated. The intercept of the fitted line corresponds to the value of $\omega^2 L^4$ for bridge structures in the absence of stress, from which the unstressed frequency of a bridge of length L can be determined.

In an additional embodiment of the invention, the process has been used to fabricate nichrome (NiCr) coated SiC cantilevers and bridge structures that can be electrostatically actuated by applying voltages between the top NiCr/SiC electrode and bottom substrate electrode.

Figure 8:
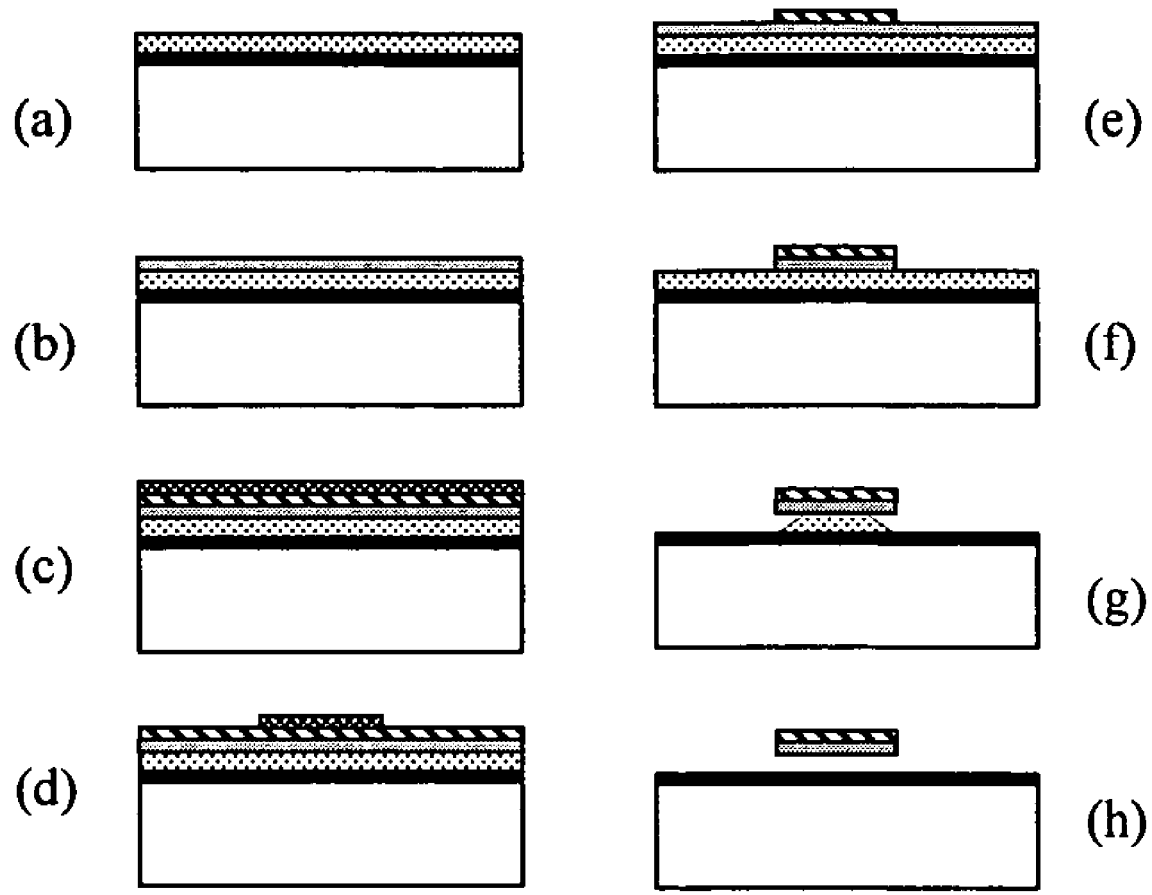
FIGS. 8a to 8h are schematic diagrams of the processing steps for fabricating a suspended SiC beam having a nichrome coating.

Single-layer SiC cantilevers are fabricated using the process sequence shown in FIGS. 8a to 8h. The starting substrates as shown in FIG. 8a consist of 3 µm thick poly-Si films deposited by low pressure chemical vapour deposition on thermally oxidized Si wafers of 100 mm diameter. The thickness of the thermal oxide is nominally 1.5 µm. The poly-Si film acts as a sacrificial layer and the $SiO_2$ film serves as an insulating layer when applying electrostatic actuation.

Polycrystalline SiC (poly-SiC) with a (110) structure is grown to a thickness of 2 µm using a known two-step, carbonization-based, atmospheric pressure chemical vapour deposition process. Following the growth of the poly-SiC film, the wafers are lightly polished using a silica-based slurry, ultrasonically cleaned in acetone and isopropanol, and then dipped in a $HCl:H_2O$ (1:1) solution to reduce surface roughness and remove resultant contamination. A 250 nm-thick NiCr layer is used as a SiC etch mask and is deposited onto the SiC surface (FIG. 8b) by thermal evaporation (Edwards Auto306). Following the NiCr deposition (FIG. 8c), a photoresist (Megaposit SPR2-2FX 1.3) layer is spun on the NiCr film and photolithographically patterned into one or more cantilever shapes (FIG. 8d). The cantilever patterns are 15 µm wide and 25, 50, 100, 150, and 200 µm long.

The patterned wafers are then exposed to a NiCr etchant (NiCr etchant TFC.) for an optimal time to remove the unmasked NiCr film (FIG. 8e) in order to minimize the undercut to the formed patterns. In order to investigate the contact properties between the NiCr and SiC layers, NiCr pads are formed on the SiC layers along with the cantilever structures. Following the NiCr patterning step, the poly-SiC films are etched in inductively coupled $SF_6/O_2$ plasma that is optimized for both SiC and Si etching (FIG. 8f).

The optimised conditions used in this example are 40 sccm $SF_6$ and 10 sccm $O_2$, 5 mT work pressure, 1000W ICP coil power and 50W chuck power, which correspond to a d.c. bias of about −100V.

The patterned NiCr is used as the etching mask. The $SF_6/O_2$ plasma firstly etches the SiC layer highly anisotropically because of the dominance of the ion-induced etch mechanism and then etches the poly-Si sacrificial layer underneath highly isotropically (FIG. 8g). The undercut step finally releases the cantilevers and formed suspended cantilever structures (FIG. 8h).

Under these conditions, the etch rate selectivity of NiCr (mask) to SiC (substrate) exceeded 60, which ensures the preservation of the NiCr layer on top of the patterned SiC layer upon completion of the ICP etch step. During this procedure, a SiC etch rate of 270 nm/min and silicon etch rate of 4 µm/min have been measured. Accordingly, the etch selectivity of SiC (mask) to poly-Si (substrate) is about 15. Therefore, SiC can act as an outstanding mask material during the undercut of the poly-Si.

The high etch selectivity of SiC to poly-Si coupled with the highly isotropic nature of the poly-Si etch means that the same plasma may be used to pattern and release the SiC beams in a single, continuous process without damaging beams during the release period of the process. FIGS. 9a and 9b show scanning electron microscope (SEM) images of released cantilever structures fabricated using the aforementioned process.

The fabricated cantilevers can be considered to consist of two adjacent electrodes forming two plates of a variable capacitor. For such a structure, the cantilever constitutes the movable plate of the capacitor and its displacement is controlled by the voltage applied across the plates, namely the top NiCr/SiC and bottom bulk Si electrodes. In a small deflection range, parallel plate theory can be applied to characterise the dynamic behaviour of an electrostatically actuated cantilever.

The electrostatic force, $F_{electrostatic}$, between the capacitor plates generated by applying a voltage V is:

$$F_{electrostatic} = \frac{V^2 \varepsilon A}{2d^2} = kZ, \qquad (2)$$

where $\varepsilon$ is the permittivity in vacuum, d is the gap between the two electrodes, A is the area of one capacitor plate, k is the spring constant of the cantilever and Z is the amplitude of deflection due to V.

Where amplitude $Z \propto V^2$.

For an a.c. voltage with a d.c. component, the square of the voltage is:

$$V^2 = (V_{ac} \sin \omega t + V_{dc})^2 = 2 V_{ac} V_{dc} \sin \omega t + 0.5 V_{ac}^2 (1 - \cos 2\omega t) + V_{dc}^2 \qquad (3)$$

where $\omega$ is the angular frequency of the applied a.c. voltage ($V_{ac}$).

Only the first and second terms contribute to the resonance of the actuators. When the applied frequency of $V_{ac}$ is chosen to be a fundamental resonance frequency ($f_0$) of the cantilevers, namely $\omega = 2\pi f_0$, only the first term can drive actuators into resonance at $f_0$. In contrast, when the applied frequency of $V_{ac}$ is chosen to be $f_0/2$ ($\omega = \pi f_0$), only the second term can result in a fundamental resonance at $f_0$.

In addition, the driving voltage and thereby the amplitude of the fundamental resonance peaks is related to $2V_{ac}V_{dc}$ and $0.5V_{ac}^2$ when $\omega = 2\pi f_0$ and $\omega = \pi f_0$, respectively.

Figure 10A:
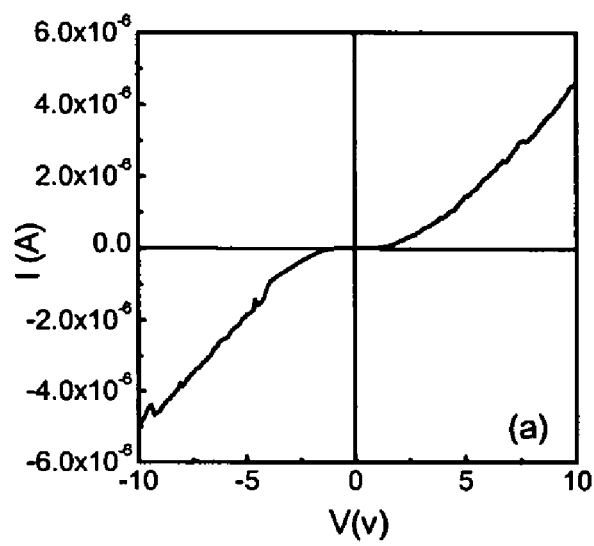
FIGS. 10a and 10b are graphs of current and voltage at the interface between the NiCr and SiC layers.
Figure 10B:
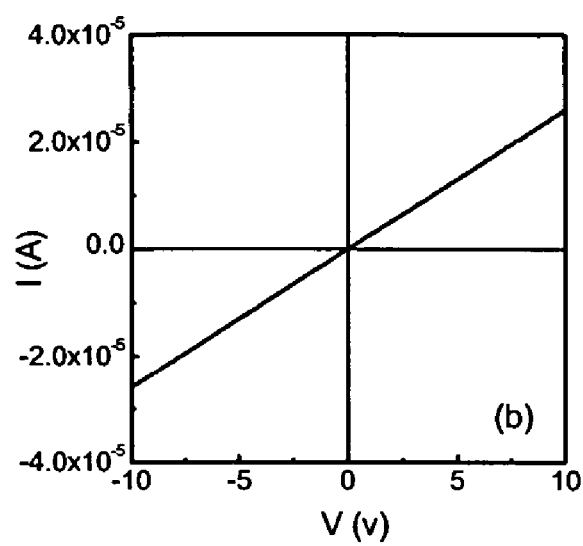

The contact properties of the interface between the NiCr and SiC layers have been measured using a standard two-point probe method on the SiC surface both before and after NiCr deposition. The I-V characteristics are shown in FIGS. 10a and 10b. Although Schottky behaviour is shown in FIG. 10a when electrically probing the uncoated poly-SiC layer, ohmic contact was achieved in FIG. 10b when NiCr metallization was used by thermal evaporation. Ohmic contact was required at the interface of NiCr/SiC as rectifying contact can create a d.c. component from a pure a.c. voltage and therefore influence the voltage and frequency characteristics of the actuators, as in equations (2) and (3).

In order to determine their fundamental resonance frequencies, the fabricated SiC cantilever actuators were subjected to extensive dynamic mechanical test by attaching them to a piezoelectric disc and vibrating them in a vacuum system. The dynamical actuation of the cantilevers was achieved through the piezoelectric disc which has been driven from a swept sine source. Using this mechanical method, the fundamental resonance frequencies $f_0$ of the cantilevers could readily be determined and are listed in Table 2 below.

|  | Cantilever length | | | | |
| --- | --- | --- | --- | --- | --- |
|  | 25 μm | 50 μm | 100 μm | 150 μm | 200 μm |
| Frequency (Hz) | 1.729 M | 868.5K | 254K | 116.6K | 66.65K |

The electrostatic performance of the actuators was characterised by applying a combination of a sinusoidal a.c. voltage (Vac) and a d.c. ($V_{dc}$) voltage between the top NiCr/SiC and bottom bulk Si electrodes. The actuators were excited electrostatically and the vibration of the beams as a function of frequency was detected using an optical vibrometer (Polytec OFV 3001). The applied frequencies of the a.c. voltages have been chosen to be $f_0$ and $f_0/2$ respectively, where $f_0$ was obtained from the dynamical measurements described above. Since the cantilevers with different lengths behaved in similar way during the test, only the results from the cantilevers of 200 μm long ($f_0$=66.65 KHz) are presented.

Figure 11A:
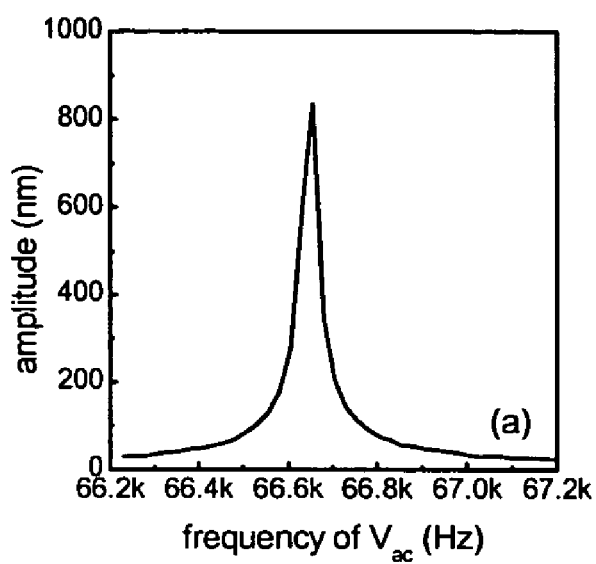
FIGS. 11a and 11b show graphs of observed fundamental resonance peaks for a 200 µm long cantilever excited by electrostatic actuation.
Figure 11B:
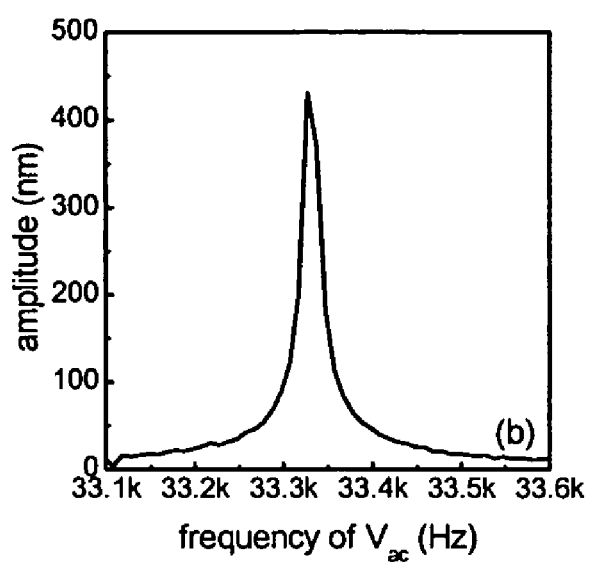
Figure 12A:
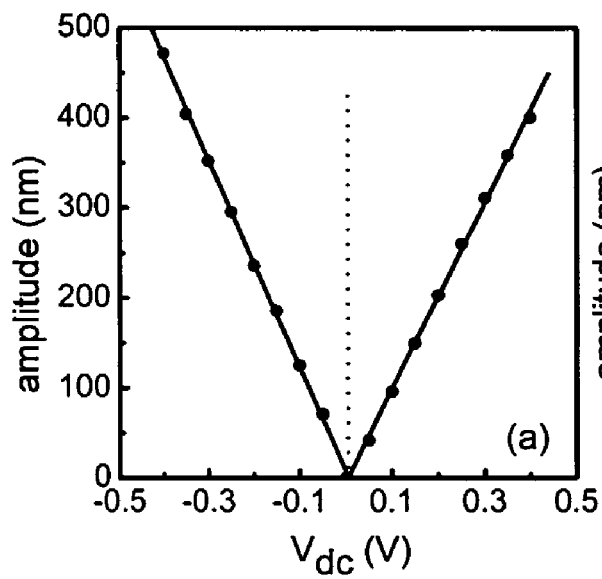
FIGS. 12a and 12b show graphs of observed amplitude and the applied $V_{dc}$.
Figure 12B:
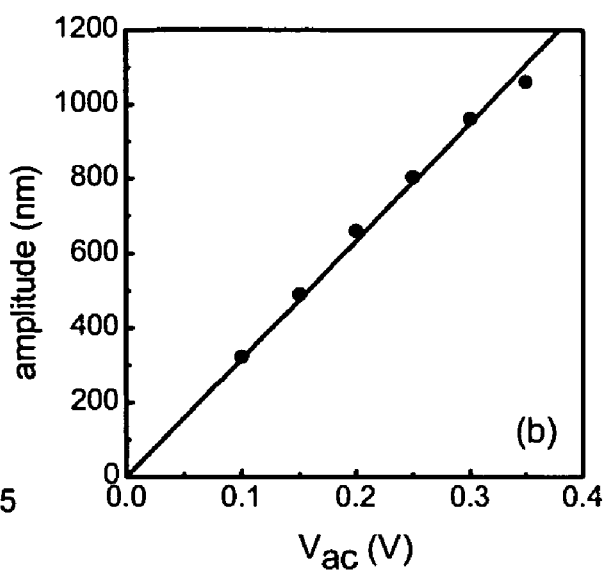

FIGS. 11a and 11b show observed fundamental resonance peaks for a 200 μm long cantilever excited by electrostatic actuation with an applied a.c. actuation frequency of 66.65 KHz ($f_0$) and 33.325 KHz ($f_0/2$) respectively. Linear relationships between the amplitude and the applied $V_{dc}$ and $V_{ac}$ components have also been detected when the a.c. voltage was applied at 66.65 KHz ($f_0$) and are shown in FIGS. 12a and 12b respectively. These results are in agreement with the expected performance of electrostatic actuators as determined by equations (2) and (3).

In the present invention the one-step dry etching method allows the fabrication of suspended SiC cantilever and doubly clamped bridge structures using an $SF_6/O_2$ ICP plasma. The dry etch condition may be optimised to take advantage of the anisotropic etch of the SiC layer and the isotropic Si etch (for the release) as well as the high selectivity between the $SiO_2$ mask and the Si layer.

Straight cantilever and bridge structures have been fabricated successfully and the resonant frequencies of the devices have been theoretical simulated and experimentally measured. By comparing the theoretically simulated and experimentally measured resonant frequencies, it has been found that the cantilever beams are substantially free of stress while the bridge structures are under significant tensile stress whose magnitude is independent of the bridge length.

The dry release step avoids the deleterious effects of surface tension that are often associated with wet release and also enables the use of metal coatings on the structural layers both as etch mask and as part of the electrodes.

Electrostatic actuators have been successfully formed using Nichrome and have been excited by applying a sinusoidal a.c. voltage with a d.c. component at the fundamental resonance frequency $f_0$ and applying only a sinusoidal a.c. voltage at $f_0/2$. It has also been observed that the amplitude Z of the fundamental resonant peaks of the cantilevers changed linearly with applied $V_{ac}$ and $V_{dc}$ respectively.

A range of MEMs devices can be created from the microstructure fabrication method described above including capacitors, mechanical resonators, pressure sensors and accelerometers.

FIGS. 13a, 13b and 14 illustrate a further aspect of the invention which relates to the ability of a dry etch plasma to tune a microstructure.

FIG. 13a shows a plurality of cantilever microstructures which have been created using a dry etch plasma. It can be seen that the thin beams of these cantilevers are curved as a result of a residual stress gradient. In this case, the cantilevers have been created using a dry etch plasma that partially destresses the beams. Further action of the $CF_4$ and $H_2$ plasma, for 4.5 hours in this example, reduces the amount of curvature in the beams as can be seen in FIG. 13b.

FIG. 14 is a graph that illustrates the effect of a relatively inert $H_2$ plasma on a 200 μm SiC cantilever beam. The x axis is a measure of the distance along the length of the cantilever from the free end of the cantilever. It should be noted that the beginning of the curve denotes the free end of the cantilever positioned at about 50 μm along the x-axis. The fixed end of the cantilever is shown at approximately 250 μm along the x axis.

The y-axis of the graph denotes the amount of deflection of the cantilever beam above the plane in which the fixed end of the beam is attached to the body of the cantilever.

Three curves are shown. The first curve has a maximum displacement of approximately 13000 nanometres, the second curve has a maximum displacement of around 12000 nanometres and the third curve has a maximum displacement of around 11000 nanometres. The first curve represents cantilever displacement before treatment with an $H_2$ plasma. The second curve represents cantilever displacement after 30 minutes treatment with the $H_2$ plasma and the third curve represents cantilever displacement after a further 60 minutes treatment with the $H_2$ plasma.

Figure 15:
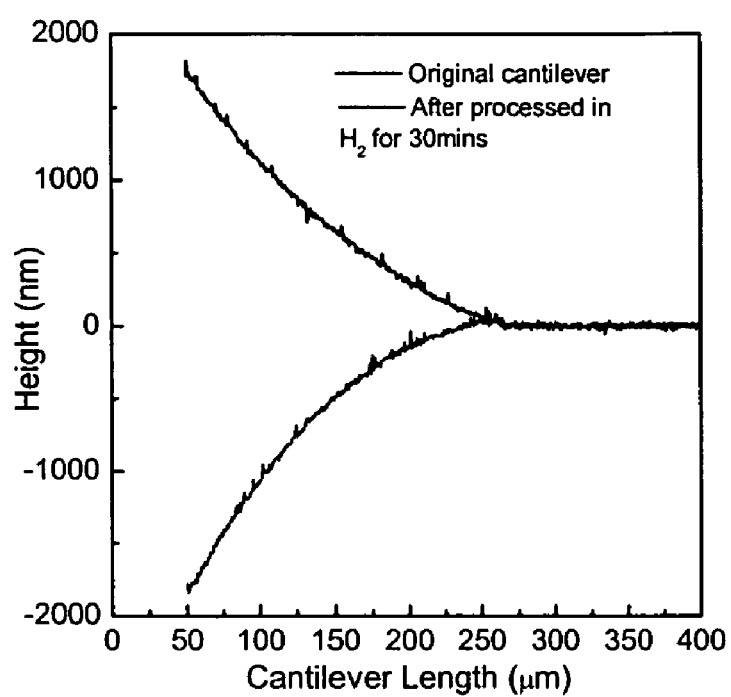
FIG. 15 is a graph which shows the effect of tuning a cantilever using a hydrogen plasma on a SiC cantilever without any mask material on top.
Figure 16:
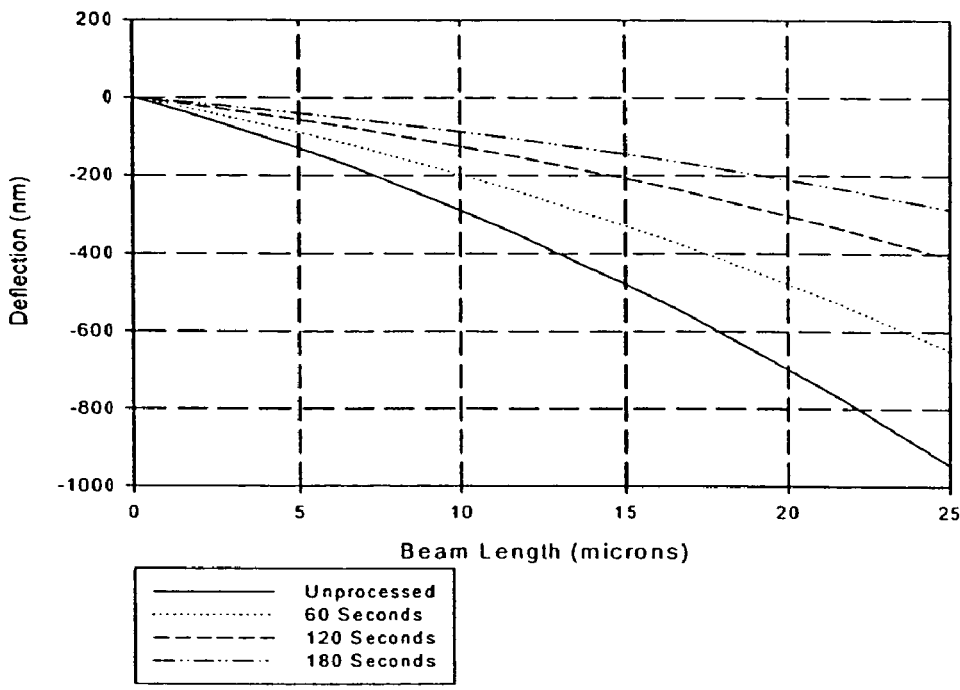
FIGS. 16 to 19 show information as a graph of beam deflection against beam length for a first set of cantilever beams treated with an Argon inductively coupled plasma.
Figure 17:
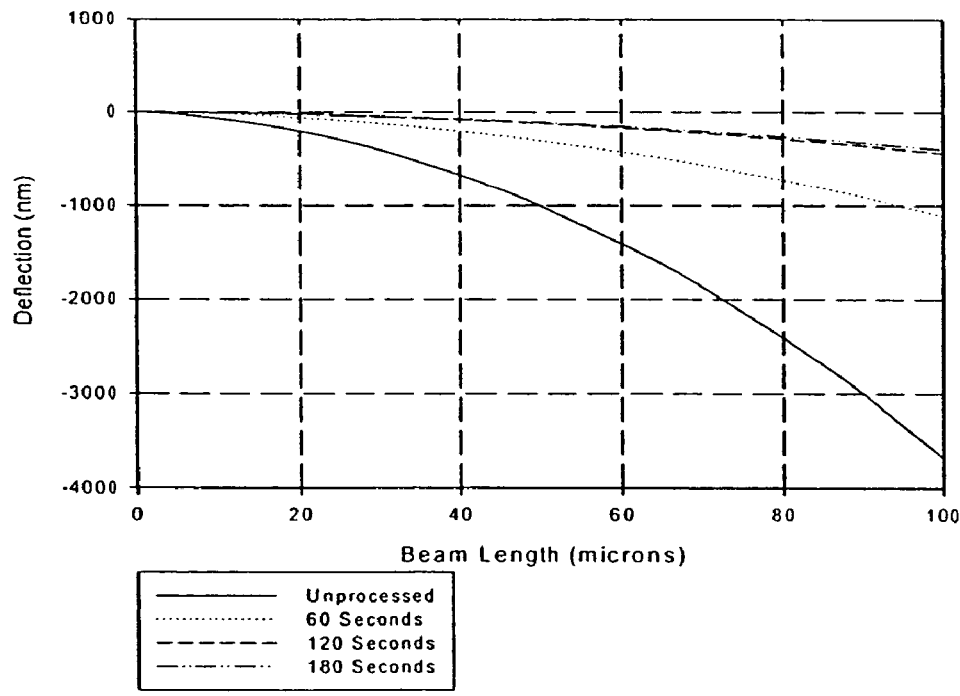
Figure 18:
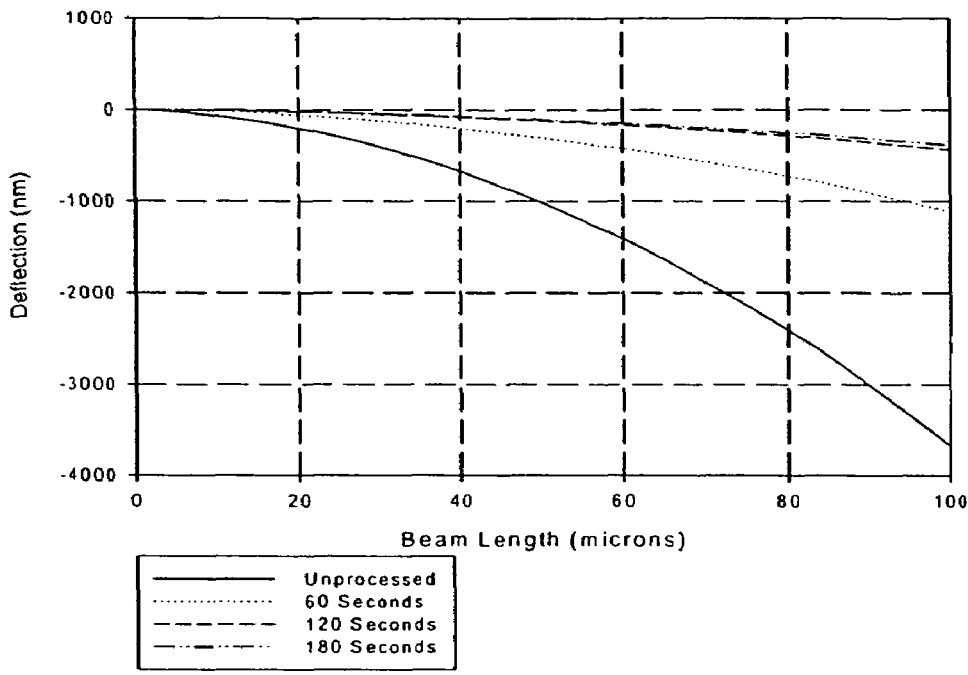
Figure 19:
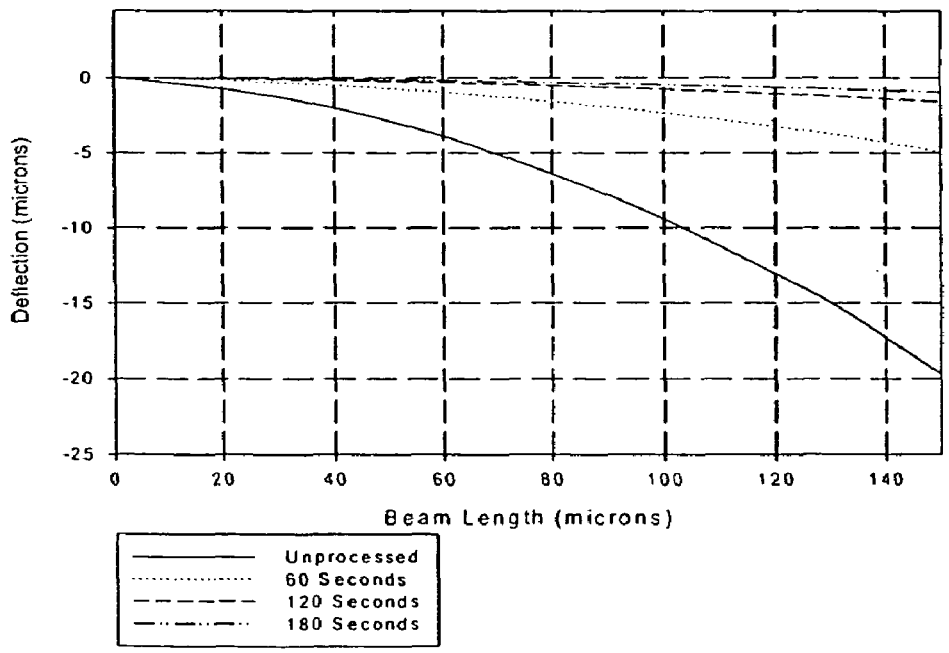
Figure 20:
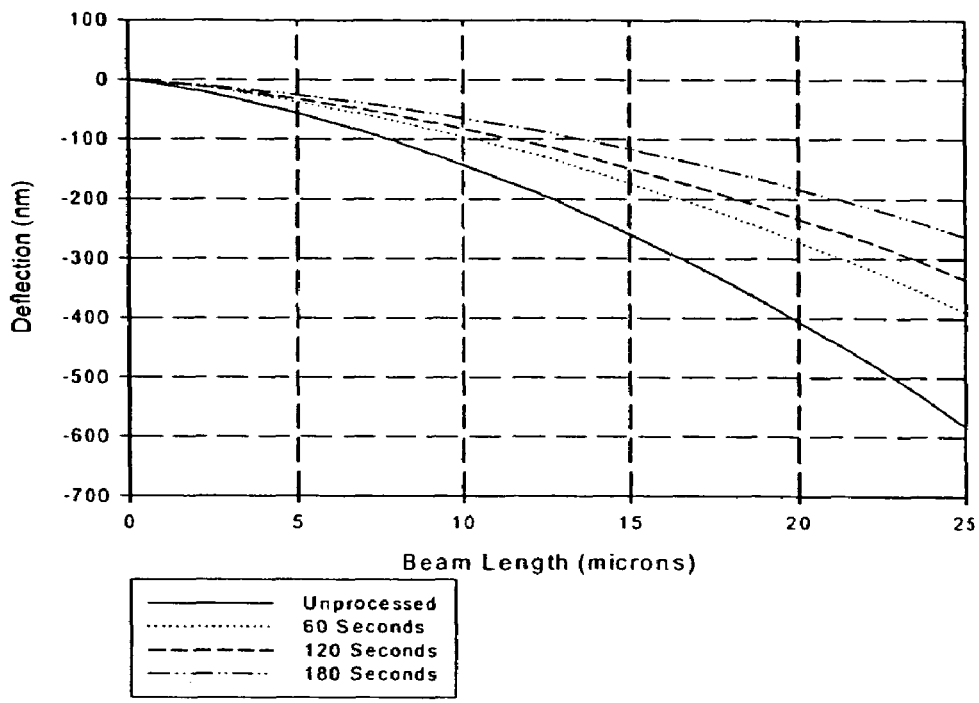
FIGS. 20 to 23 show information as a graph of beam deflection against beam length for a second set of cantilever beams treated with an Argon inductively coupled plasma.
Figure 21:
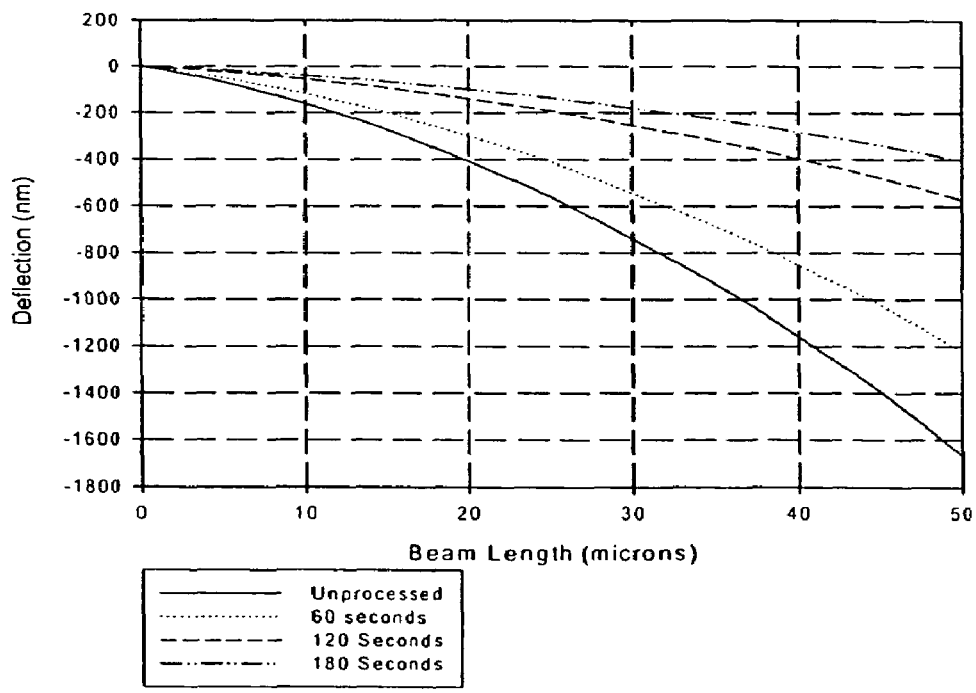
Figure 22:
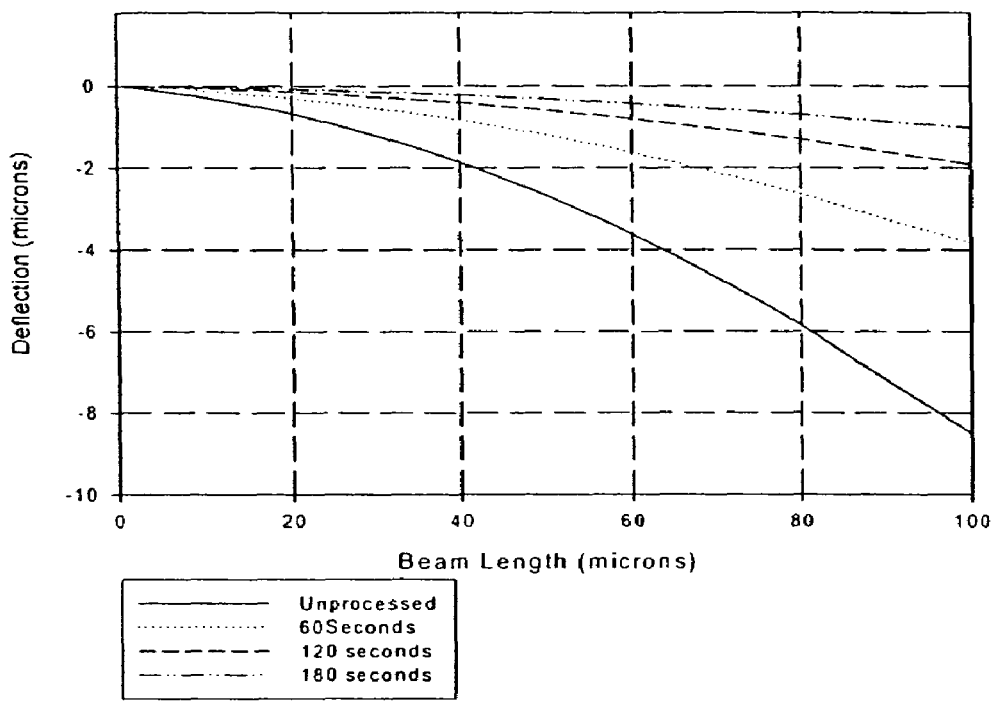
Figure 23:
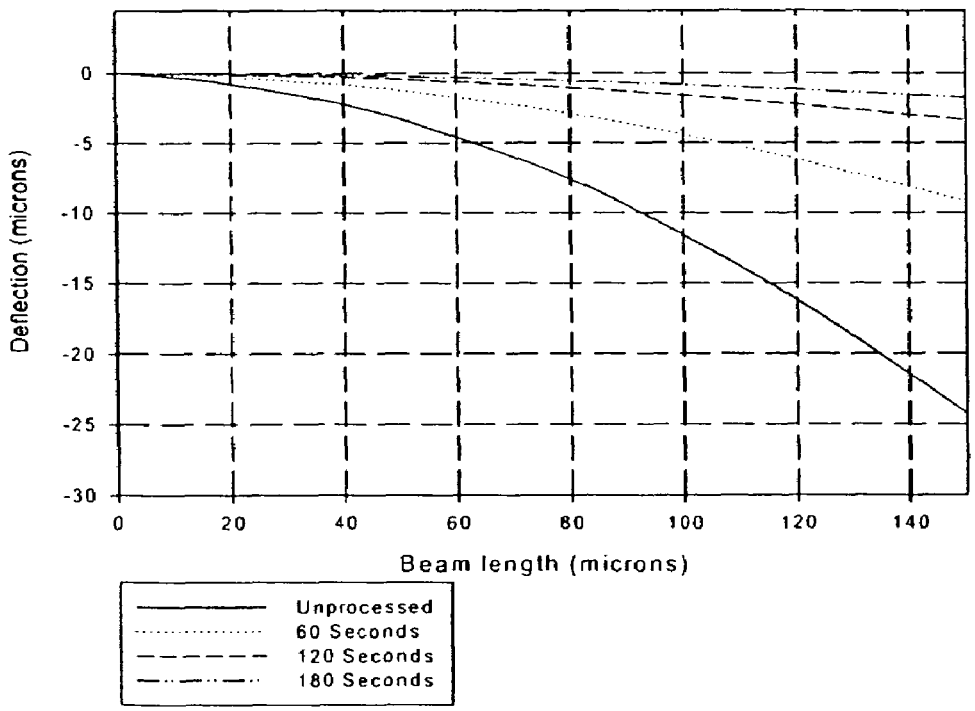
Figure 24:
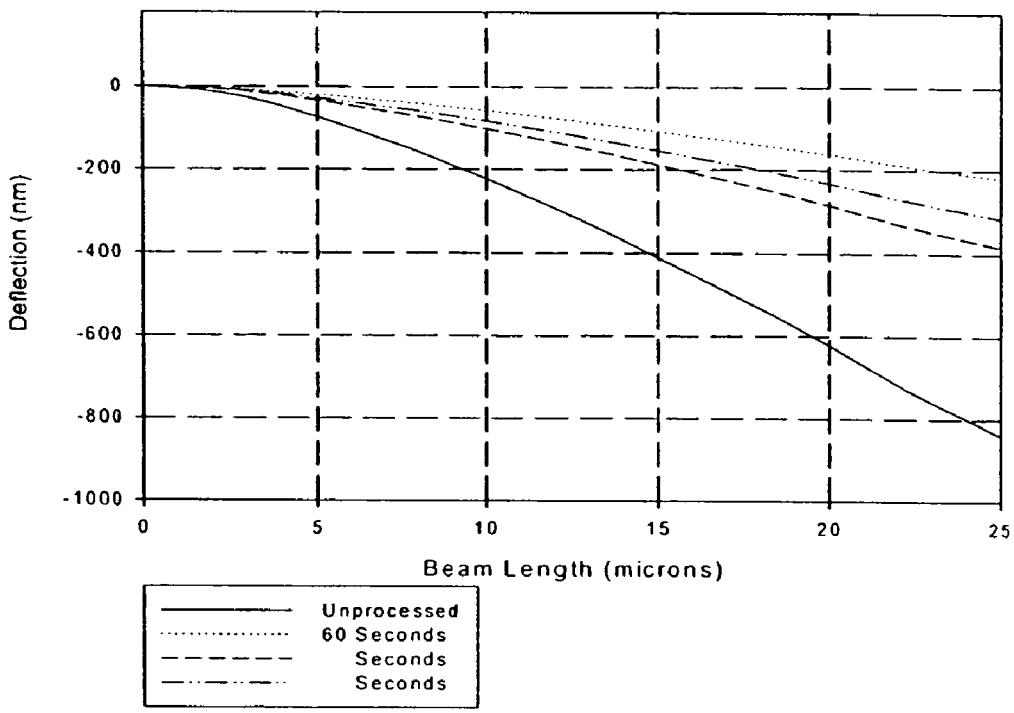
FIGS. 24 to 27 show information as a graph of beam deflection against beam length for a third set of cantilever beams treated with an Argon inductively coupled plasma.
Figure 25:
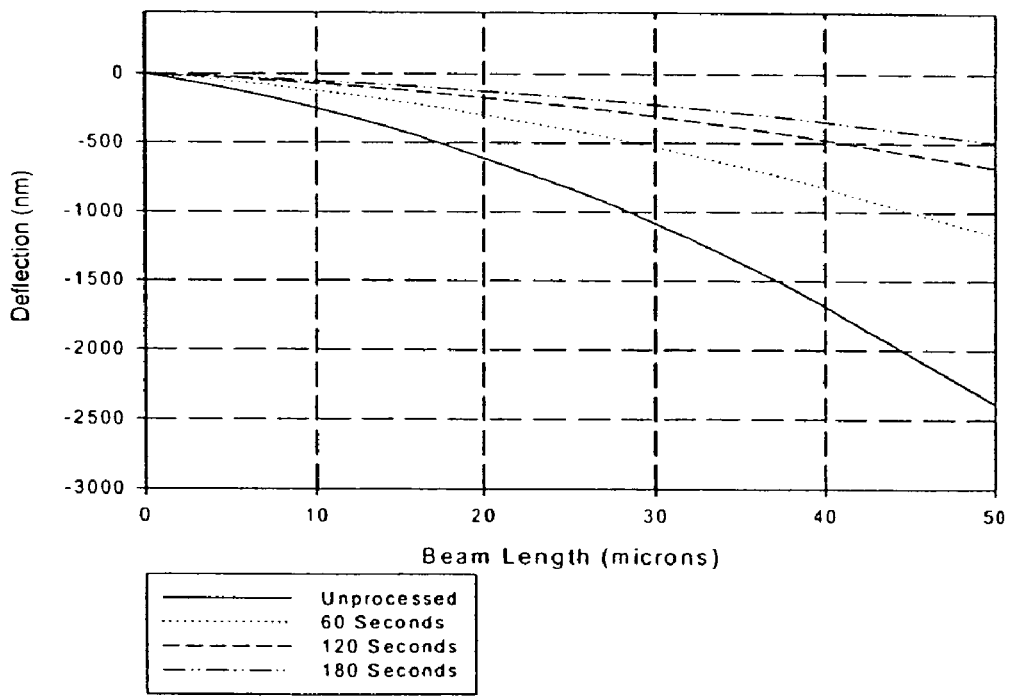
Figure 26:
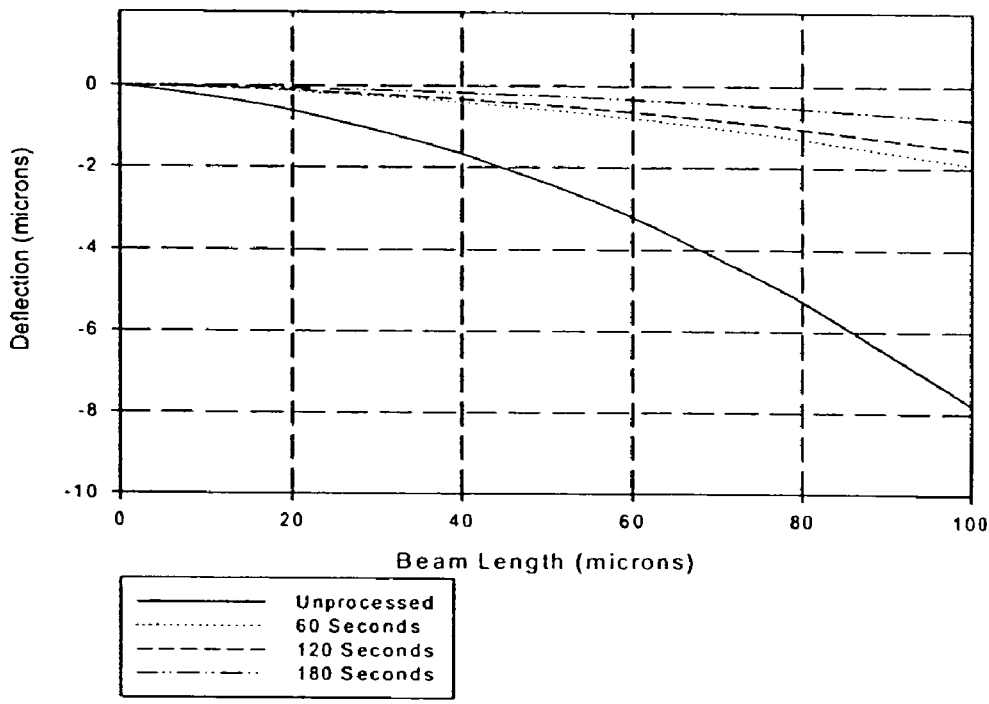
Figure 27:
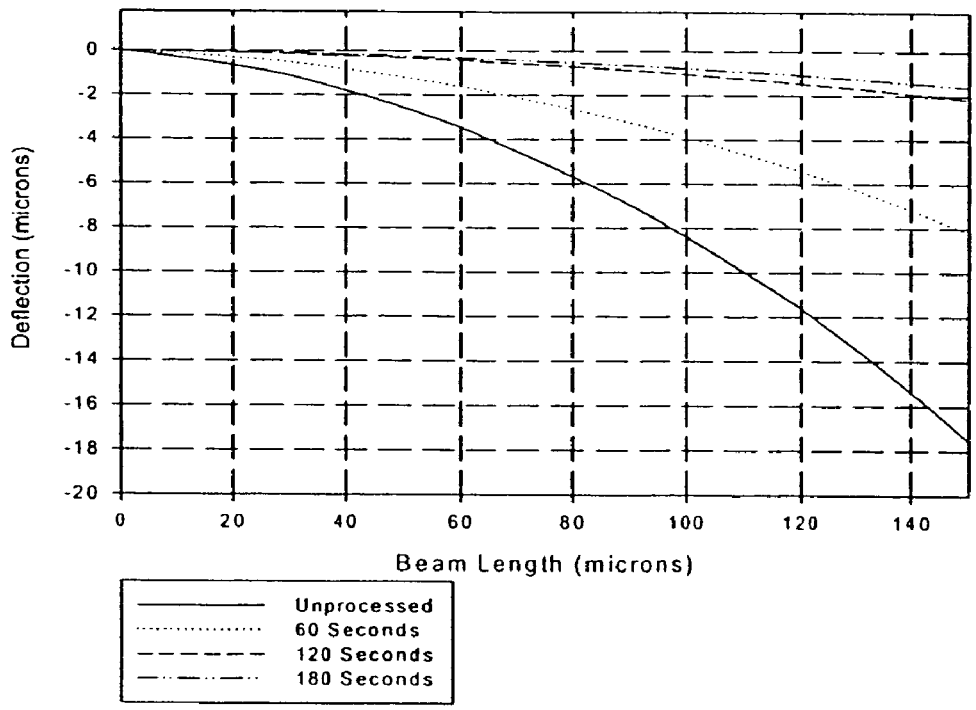

FIG. 15 shows the tuning effect of a hydrogen plasma on a SiC cantilever structure in the absence of a mask.

The "Original Cantilever" curve shows a positive bend in the cantilever from a height of around 2000 nm at it's free end to the zero deflection position at its fixed end.

However, once the cantilever has been processed in a hydrogen plasma for 30 minutes, the free end of the beam is bent downwards below the plane of the fixed end of the cantilever beam to have a negative deflection of around 2000 nm. Accordingly, the shape of the cantilever can be tuned by applying a plasma for a predetermined time.

FIGS. 16 to 27 illustrate the method of tuning a MEMs device in accordance with the present invention. These figures show the use of inert Argon ions to release compressively stressed free-standing cantilevers, by subjecting the beams to an Argon inductively coupled plasma at 150 V for, in these examples, up to 3 minutes. The data is arranged in three sets (sets G, H and I) and each set provides the graphs of FIGS. 16 to 27 which plot beam deflection against beam length. Each of the curves represents the change in beam deflection after processing with a dry etch plasma containing Argon ions. In all cases a characteristic curve is created which can be used to obtain information on the change in deflection (straightening) that is possible.

These figures clearly illustrate that it is possible to control the deflection of the beams by controlled application of the dry etch plasma containing inert gas ion, in this example Argon ions.

The following tables clearly illustrate the change in deflection over pre-determined plasma exposure times for sets G, H, and I.

| Beam length (µm) | % change compared to initial deflection after Ar plasma exposure at 150 V | | |
| --- | --- | --- | --- |
| | % change after 60 s | % change after 120 s | % change after 180 s |
| Set G | | | |
| 25 | 31.36 | 56.63 | 69.77 |
| 50 | 69.79 | 88.15 | 89.24 |
| 100 | 69.79 | 88.15 | 89.52 |
| 150 | 75.07 | 91.82 | 95.12 |
| Set H | | | |
| 25 | 33.11 | 42.61 | 54.92 |
| 50 | 26.55 | 65.81 | 75.78 |
| 100 | 54.91 | 77.54 | 87.91 |
| 150 | 61.95 | 86.14 | 92.68 |
| Set I | | | |
| 25 | 54.26 | 62.61 | 73.95 |
| 50 | 50.95 | 71.58 | 79.33 |
| 100 | 75.37 | 80.08 | 89.58 |
| 150 | 53.39 | 87.64 | 90.83 |

The ability to control or tune the degree of deflection improves the quality of the MEM's devices that can be manufactured. In addition MEMs devices can be made where the degree of deflection in a cantilever beam can be controlled.

Advantageously, an inert or substantially inert plasma can be used where no additional etching of the microfabricated structure is required.

The use of a commercial plasma where the ions possess an acceleration of around 250V provides a low energy alternative to known material de-stressing techniques such as bombarding the material with electrons energized using voltages of the order of kilovolts. In one embodiment of such use of a commercial plasma, the gas glow rate is about 40 sccm, the pressure is about 10 mT, and the plasma is an inductively coupled high-density plasma at 13.56 MHz.

An embodiment of the present invention provides a method for tuning MEMs structures by removing stress caused by differences in the coefficients of thermal expansion of the layers in the structure. Argon ions have provided a means for releasing compressive stress in a beam and $H_2$ ions have provided a means for releasing tensile stress. The presence of the inert ions may allow the microstructure to de-stress by means of a relaxation mechanism in the lattice of the microstructure without causing additional etching to occur. Improvements and modifications may be incorporated herein without deviating from the scope of the invention.

The invention claimed is:

1. A microstructure fabrication method comprising the steps of:
reacting a dry etch plasma with a layered microstructure, the layered microstructure having an etch mask, a silicon layer and a silicon carbide layer arranged between the etch mask and the silicon layer, wherein the dry etch plasma is introduced into the environment of the layered microstructure such that the silicon carbide layer is etched anisotropically and the silicon layer is etched substantially isotropically.

2. The method as claimed in claim 1 wherein, the high density dry etch plasma has a density of greater than $10^{10}$ ions/cm$^3$.

3. The method as claimed in claim 2 wherein, the high density dry etch plasma is inductively coupled.

4. The method as claimed in claim 3 wherein, a 1000W ICP coil power and 50W chuck power corresponds to 100V dc bias inductively couples the dry etch plasma.

5. The method as claimed in claim 2 wherein, the high density dry etch plasma is an electron cyclotron resonance plasma.

6. The method as claimed in claim 2 wherein, the high density dry etch plasma is a reactive ion etching plasma.

7. The method as claimed in claim 2 wherein, the high density dry etch plasma contains a fluorinated plasma.

8. The method as claimed in claim 7 wherein, the plasma contains $SF_6$.

9. The method as claimed in claim 1 wherein, the high density dry etch plasma has a density of greater than $10^{11}$ ions/cm$^3$.

10. The method as claimed in claim 1 wherein, the silicon layer is situated on a substrate.

11. The method as claimed in claim 10 wherein, the substrate layer comprises silicon.

12. The method as claimed in claim 1 wherein, the silicon layer and the substrate are made from the same material.

13. The method as claimed in claim 1 wherein, the dry etch plasma is introduced into the environment of the layered microstructure in a single step.

14. The method as claimed in claim 1 wherein, the silicon layer comprises silicon.

15. The method as claimed in claim 14 wherein, the silicon layer comprises polysilicon.

16. The method as claimed in claim 15 wherein the silicon layer is etched selectively with respect to the silicon carbide layer.

17. The method as claimed in claim 16 wherein the etch rate of silicon carbide to silicon or polysilicon is highly selective.

18. The method as claimed in claim 17 wherein, the etch selectivity for silicon and silicon carbide is 10:1 or greater.

19. The method as claimed in claim 17 wherein the high density dry etch plasma is used to pattern and release the SiC beams in a single, continuous process without damaging beams during the release period of the process.

20. The method as claimed in claim 1 wherein, the silicon carbide layer comprises silicon carbide.

21. The method as claimed in claim 20 wherein the silicon layer is etched selectively with respect to the silicon carbide layer.

22. The method as claimed in claim 21 wherein the etch rate of silicon carbide to silicon or polysilicon is highly selective.

23. The method as claimed in claim 22 wherein the high density dry etch plasma is used to pattern and release the SiC beams in a single, continuous process without damaging beams during the release period of the process.

24. The method as claimed in claim 22 wherein, the etch selectivity for silicon and silicon carbide is 10:1 or greater.

25. The method as claimed in claim 1 wherein, the etch mask comprises silicon dioxide.

26. The method as claimed in claim 1 wherein, the etch mask comprises Nichrome.

27. The method as claimed in claim 1 wherein, the etch mask is shaped to allow the production of a cantilever structure.

28. The method as claimed in claim 1 wherein, the etch mask is shaped to allow the production of a bridge structure.

29. The method as claimed in claim 1 wherein, dry etch plasma contains $O_2$.

30. The method as claimed in claim 1 wherein the dry etch plasma contains $SF_6$ and $O_2$.

31. The method as claimed in claim 30 wherein, the $SF_6/O_2$ mixture is optimized to etch the silicon carbide layer anisotropically and the silicon layer isotropically with high selectivity using the etch mask.

32. The method as claimed in claim 31 wherein, the $SF_6/O_2$ gas mixture is optimized to contain 20% $O_2$.

33. The method as claimed in claim 31 wherein, the dry etch plasma comprises 40 sccm $SF_6$ and 10 sccm $O_2$ at a working pressure of 5 mT pressure.

34. The method as claimed in claim 1 wherein, the method further comprises a wet etch step for the purpose of enhancing the removal of the etch mask.

35. The method as claimed in claim 1 wherein, the method further comprises a dry etch step for enhancing the removal of the etch mask.

* * * * *